(12) United States Patent
Lenoble

(10) Patent No.: US 7,781,315 B2
(45) Date of Patent: Aug. 24, 2010

(54) FINFET FIELD EFFECT TRANSISTOR INSULATED FROM THE SUBSTRATE

(75) Inventor: Damien Lenoble, Crolles (FR)

(73) Assignees: STMicroelectronics (Crolles 2) SAS, Crolles Cedex (FR); Interuniversitair Micro-Electronica Centrum, Leuven (BE)

( * ) Notice: Subject to any disclaimer, the term of this patent is extended or adjusted under 35 U.S.C. 154(b) by 38 days.

(21) Appl. No.: 12/146,166

(22) Filed: Jun. 25, 2008

(65) Prior Publication Data

US 2009/0001463 A1    Jan. 1, 2009

(30) Foreign Application Priority Data

Jun. 26, 2007    (FR) .................................. 07 04568

(51) Int. Cl.
 *H01L 21/425*    (2006.01)
(52) U.S. Cl. ................ 438/514; 438/542; 257/E21.409
(58) Field of Classification Search ................. 257/344; 438/514, 197
See application file for complete search history.

(56) References Cited

U.S. PATENT DOCUMENTS

| 7,235,468 B1 * | 6/2007 | Mouli ........................ 438/514 |
| 2002/0011612 A1 | 1/2002 | Hieda |
| 2005/0156202 A1 | 7/2005 | Rhee et al. |
| 2006/0252191 A1 * | 11/2006 | Kammler et al. ............ 438/197 |
| 2007/0102763 A1 | 5/2007 | Yeo |

OTHER PUBLICATIONS

Preliminary French Search Report, FR 07 04568, dated Feb. 6, 2008.

* cited by examiner

*Primary Examiner*—Thanh V Pham
*Assistant Examiner*—Mark A Laurenzi, III
(74) *Attorney, Agent, or Firm*—Gardere Wynne Sewell LLP

(57) ABSTRACT

A finFET field effect transistor is produced by the formation of an electrical junction between the thin fin portion of semiconductor material which forms the channel of the transistor and the circuit substrate. Doping particles are implanted in the substrate through a mask which is then subsequently used to form the thin fin portion of the channel. The channel of the finFET transistor is thus electrically insulated from the circuit substrate in the same manner as in MOS integrated circuits realized from bulk silicon substrates.

24 Claims, 1 Drawing Sheet

FINFET FIELD EFFECT TRANSISTOR INSULATED FROM THE SUBSTRATE

PRIORITY CLAIM

The present application is a translation of and claims priority from French Patent Application No. 07 04568 of the same title filed Jun. 26, 2007, the disclosure of which is hereby incorporated by reference to the maximum extent allowable by law.

BACKGROUND OF THE INVENTION

1. Technical Field of the Invention

The present invention relates to a process for realizing a fin field effect transistor (finFET), as well as to a transistor of the type obtained by such a process.

2. Description of Related Art

Many integrated circuits have been created experimentally which incorporate one or more finFET field effect transistors. Such a transistor comprises a channel which is oriented to conduct an electrical current parallel to the surface of a substrate of the circuit, and which has a section elongated perpendicularly to this substrate surface. Such a field effect transistor structure is suitable for forming a gate which is placed on both of the large sides of the channel, to provide control of the conductive state of the transistor. It is also suitable for manufacturing a multi-channel transistor in which neighboring channels are separated by an intermediate gate portion.

A finFET transistor is created from at least one thin portion ("fin") of semiconductor material which is used to form the channel of the transistor, and possibly also its source and drain zones. This fin is defined by a mask which is formed on the monocrystalline silicon substrate at the position of said fin. The substrate material is then directionally etched where there is no mask, to a determined depth which is greater than that of the mask, such that the fin remains under the mask and is composed of the initial material of the substrate.

The fin of semiconductor material which is thus obtained, and which comprises the channel of the final transistor, is not electrically insulated from the active portion of the circuit substrate, which itself is also of crystalline semiconductor material. Three types of leakage current result. A first type of leakage current can circulate between the source and drain zones of the finFET transistor, via the active portion of the substrate situated below the channel. This first leakage current, internal to each transistor, is not controlled by its gate. In addition, the channel of the finFET transistor is also in electrical contact with the channels of other transistors of the same type via the substrate, which produces a second type of leakage current flowing between different transistors, i.e. inter-transistor leakage currents. A third type of leakage current may also appear between the channel of each finFET transistor and a lower part of the substrate when said part is connected to a reference potential terminal.

To avoid these leakage currents, it is known to realize the finFET transistor on an integrated circuit substrate which is of the SOI (Silicon on Insulator) type. Such a substrate comprises, in a lower part, an intermediate layer of electrically insulating material which is topped by a crystalline silicon layer. U.S. Pat. No. 6,645,797 discloses such a process for realizing a finFET transistor from an SOI substrate. The transistor which is obtained is electrically insulated from the lower part of the substrate by the intermediate layer of insulating material. However, the use of an SOI substrate increases the manufacturing cost of the integrated circuit.

It is also known to realize an electrical junction in proximity to the contact surface between the active portion of the substrate and the fin of the channel. Such an electrical junction, when it is reverse polarized, electrically insulates the channel of the transistor from the active portion of the substrate.

In a first method commonly used to realize such an electrical junction, the fin is first obtained and electrically doped by a first type of doping. Doping particles of a second type which are the opposite of the first doping type are then implanted in a lower part of the fin, using an oblique beam for the implantation which is oblique to the base of the fin, starting from each side. Implantation of doping particles in the middle and upper parts of the fin must be avoided, to conserve the electrical efficiency of the first doping in these parts destined to be used to form the transistor channel. In spite of operative precautions, however, doping particles of the second doping type are also unintentionally implanted in the channel. These then cause a reduction in the mobility of the channel carriers, as well as unintentional variations in the effective concentration of these carriers. The electrical conduction properties of finFET transistors realized in this manner under identical operating parameters therefore vary in an uncontrolled manner, leading to a low reproducibility of the electronic circuits obtained.

In a second method, the fin is still obtained and electrically doped in a first step, while covered by a mask. Doping particles of type opposite those doping the fin are then implanted in the substrate, except for the area of the substrate surface which is occupied by the fin and covered by the mask. The particles doping the substrate are implanted using a directional beam perpendicular to the substrate surface, to avoid the penetration of some of these particles into the fin through its lateral sides which are perpendicular to the substrate surface. An electrical junction then appears in the active part of the substrate, below the fin, due to a lateral diffusion of the doping particles parallel to the substrate surface, below the fin.

This second method presents the following disadvantages. Firstly, the properties of the electrical junction which is thus obtained are highly dependent on the width of the fin. This width is not always controlled with sufficient accuracy, however. The electrical insulation of the transistor channel then presents uncontrolled fluctuations between finFET transistors realized under identical operating parameters. In addition, because of a residual divergence of the beam which implants the doping particles in the active portion of the substrate, and/or because of an unintentional slope in the lateral sides of the fin, doping particles intended for the active portion of the substrate are also implanted in the fin. There are still unintentional variations in the mobility and concentration of the channel carriers.

In addition, in the two known methods described above, the unintentional implantation of doping particles, intended for the active portion of the substrate, into the lateral sides of the fin causes faceting of these sides. Such faceting prevents from obtaining an interface between the channel and the insulating gate layer of the finFET transistor which is slightly rough.

A need exists in the art for realizing a finFET transistor in a manner which does not have the disadvantages described above. In particular, a need exists in the art for realizing a finFET transistor which is compatible with the use of a bulk substrate for integrated circuits, resulting in a transistor which is electrically insulated from the substrate.

SUMMARY OF THE INVENTION

In an embodiment, a process for realizing a finFET field effect transistor on an integrated circuit substrate, comprises: (1) forming a mask on a surface of the substrate, with an opening in the mask which is located above an exposed part of an active portion of this substrate of crystalline semiconductor material, and (2) forming, by epitaxial growth from the part of the active portion exposed in the mask opening, a thin portion (fin) of crystalline semiconductor material which comprises at least the transistor channel.

The process additionally comprises, between the above steps (1) and (2): realizing an implantation of doping particles through the mask opening into the exposed part of the active portion of the substrate, so as to create in said part an electrical doping of a second type opposite the first type of doping used for the transistor channel.

In accordance with the finFET transistor structure, the channel constituted of a part of the fin of crystalline semiconductor material has a direction of conduction which is parallel to the substrate surface. It also has a section perpendicular to this direction of conduction which is elongated perpendicularly to the substrate surface.

Thus, in a first characteristic, the fin which forms the channel is constituted of a material which is deposited on the substrate in step (2), and which therefore is not initially a part of the substrate.

In a second characteristic, the implantation of doping particles into the active portion of the substrate is performed before the fin is formed. In this manner, the fin, and consequently the channel of the finFET transistor which is realized, is completely devoid of the particles used to dope the active portion of the substrate. The electrical properties of the channel are therefore not altered by such particles of a type opposite those used in doping the fin. In particular, the mobility and concentration of the channel carriers are not inadvertently reduced. In addition, the roughness of the lateral sides of the fin is not increased by undesired faceting.

In the finFET transistor which is obtained, the channel and the active portion of the substrate have opposite types of doping and are directly in contact with each other. An electrical junction is thus formed, electrically insulating the channel from the lower part of the substrate as well as from other transistor channels on the same substrate. This electrical junction also has reproducible properties. In particular, these properties are independent of the width of the fin measured parallel to the substrate surface.

Also, the same mask is used to limit transversally the implantation of doping particles into the active portion of the substrate and to define the dimensions of the fin. The result is that the electrical junction insulating the channel is limited to the zone of the substrate which is occupied by the fin. In this manner, the electrical conductivity of the substrate remains very low outside the zone occupied by the fin, which contributes to further reducing any leakage currents flowing in the substrate.

A first advantage of such a process results from the formation of the fin by epitaxial growth from the substrate. Such a method for forming material on an integrated circuit is well understood and allows high production yields.

A second advantage arises from the type of electrical insulation which is created between each transistor and the substrate. This insulation is similar to that of MOS technology ("Metal Oxide Semiconductor") with bulk substrate. The knowledge acquired from this technology can therefore be partially applied to a circuit realized according to the process.

In one improvement, the fin may comprise source and drain zones of the transistor, in addition to comprising the channel. These are then electrically insulated from the active portion of the substrate in the same manner as the channel, such that no leakage current can flow in the substrate between the source and drain of the transistor.

An integrated circuit is proposed which incorporates a finFET field effect transistor, and which comprises: a substrate having an active portion of crystalline semiconductor material, and a thin portion (fin) of crystalline semiconductor material, comprising the channel of the transistor and having an electrical doping of a first type, and being in contact with the active portion of the substrate at a surface of said substrate.

In such a circuit, a part of the active portion of the substrate which is in contact with the fin is doped by a second type of doping which is opposite the first type. In addition, this doped part of the active portion has a doping boundary which is aligned with a side of the fin, perpendicularly to the substrate surface.

Such a finFET transistor circuit may in particular be realized using a process as described above. In this case, the alignment of the doping boundary of the doped part of the part of active portion of the substrate, results from using the same mask to selectively dope the part of active portion and to define the transverse dimensions of the fin parallel to the substrate surface.

In an embodiment, a method comprises: forming a mask on a surface of a substrate, said mask including an elongated opening exposing an active portion of the substrate and defining a trench; implanting a first type of doping particles through the elongated opening into said exposed active portion so as to create a doped region in the substrate having edges defined by the elongated opening; epitaxially growing a thin fin portion of crystalline semiconductor material to fill at least a portion of the trench and provide at least a channel of a transistor; and doping the thin fin portion of the crystalline semiconductor material with a second type of doping particles opposite the first type.

In an embodiment, an integrated electronic circuit comprises: a substrate; an elongated doped region in the substrate having edges, the doped region being of a first conductivity type; and an epitaxially grown thin fin portion of crystalline semiconductor material defining an elongated channel region having edges aligned with the edges of the elongated doped region in the substrate; the thin fin portion being doped of a second conductivity type opposite the first type.

BRIEF DESCRIPTION OF THE DRAWINGS

Other features and advantages of the invention will become clear in the description which follows of several non-limiting examples, with references to the attached drawings wherein.

DETAILED DESCRIPTION OF THE DRAWINGS

Figure 1:
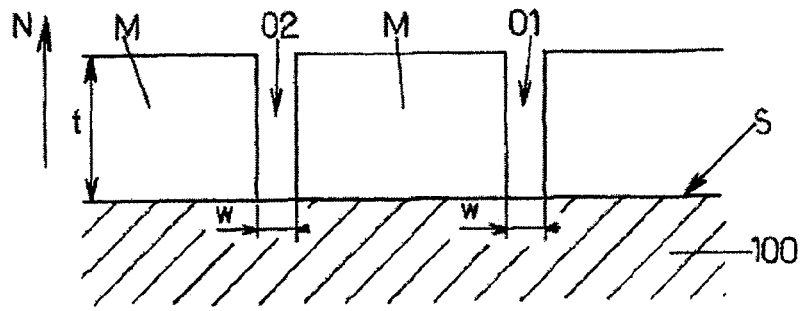
FIGS. 1-4 illustrate the successive steps of a process for realizing an integrated circuit.
Figure 2:
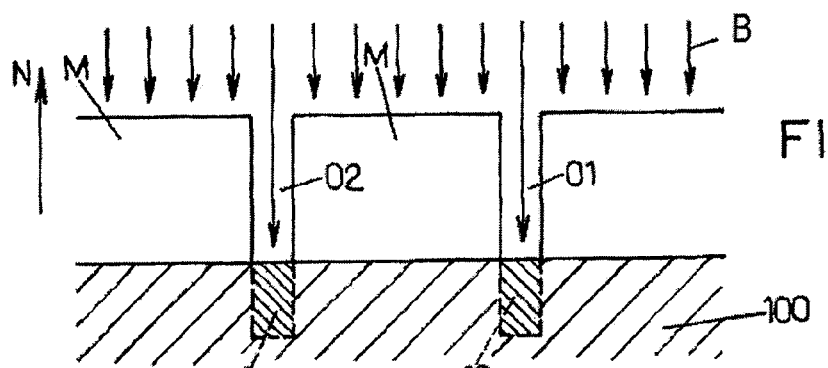
Figure 3:
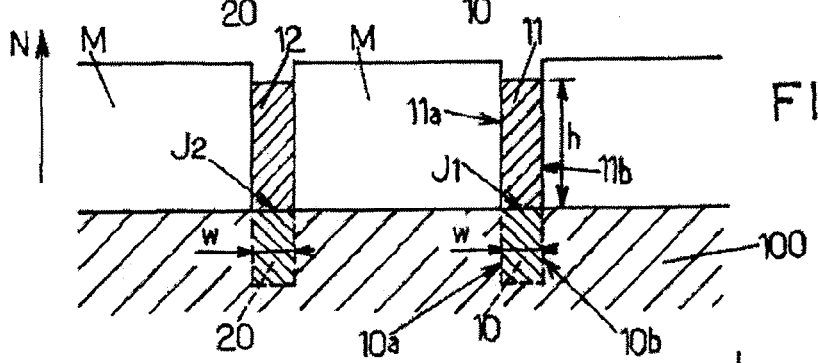

For reasons of clarity, the dimensions of the various elements represented in these figures are not in proportion to the true dimensions or dimension ratios. FIGS. 1-3 are cross-section views of an integrated circuit during its realization from a substantially flat substrate, viewed perpendicularly to the substrate surface. N indicates a direction perpendicular to the substrate surface, pointing towards the exterior of the substrate. This direction is indicated in all the figures. The terms "on", "under", "below", and "above", used concerning the circuit in the following description, are relative to this orientation.

In what follows, the basic steps in the process for realizing an integrated circuit which are known to a person skilled in the art are not described in detail. Only the succession of basic steps which allows reproducing the transistor are described.

According to FIG. 1, a bulk substrate for integrated circuits is composed of monocrystalline silicon, weakly doped or undoped. It is labeled 100 and has an upper surface S which is flat. A portion of this substrate which is adjacent to the surface S is used to form at least one, and in this example two, finFET transistors in proximity to each other. This portion is called the active portion of the substrate.

A mask M is formed on the surface S of the substrate 100, with said mask presenting openings at the locations for the transistors to be realized. In FIG. 1, these openings are labeled O1 and O2. They have widths w which can be between about 10 and 100 nm (nanometers). The mask M may be of silica ($SiO_2$) chemically deposited from gas precursors, for example, and may have a thickness t which is between 10 and 100 nm in the direction N, and preferably between 60 and 100 nm. The openings O1 and O2 may be formed, for example, using a resin lithographic mask and a process for directionally etching the mask M.

Doping particles are then implanted in the parts of the active portion of the substrate 100 which are exposed in the openings O1 and O2. To this end, the doping particles are accelerated in the form of a beam B which is aimed at the upper surface of the circuit, parallel to the direction N but in the opposite direction (FIG. 2). The surface of the circuit is scanned with the beam B. The doping particles are thus selectively implanted in the substrate 100, inside the parts of the active portion which are labeled 10 and 20 and which are delimited by the edges of the openings O1 and O2 parallel to the surface S of the substrate 100. The depth of the parts 10 and 20 in the direction N, and the concentration of the doping particles in these parts, are determined by the power and intensity of the beam B.

After implantation of the parts 10 and 20, the mask M is retained on the circuit. A deposition of crystalline semiconductor material is then performed, under conditions which are adapted to obtain epitaxial growth of the material which is formed from the exposed crystalline semiconductor material already present in the circuit. In this manner, monocrystalline portions 11 and 12 are formed (FIG. 3), which are for example of silicon or an alloy of silicon and germanium, or of silicon incorporating carbon. The composition of the portions 11 and 12 may be chosen in particular to obtain a constituent material for the portions which is prestressed. Preferably, the formation of the portions 11 and 12 is stopped before they rise above the mask M. This way the portions 11 and 12 have lateral sides parallel to the direction N which are flat up to the tops of these portions.

Due to the use of the mask M for the selective implantation of the parts 10 and 20 of the substrate 100 and then for forming the portions 11 and 12, each doped part 10, 20 of the substrate has two opposite boundaries which are respectively aligned with two opposite sides of the corresponding portion 11, 12, in the direction N. In FIG. 3, the lateral boundaries of the doped part 10 of the active zone of the substrate 100 are labeled 10a and 10b, and the sides of the portion 11 are labeled 11a and 11b. The portions 11 and 12 therefore each have a width w which is common with the doped parts 10 and 20 of the substrate. Given that the portions 11 and 12 have a height h in the direction N which is preferably greater than the width w, the portions 11 and 12 are called "fins".

The portions 11 and 12 may be doped either directly during their epitaxial formation, or after their formation in a separate step. The doping of the portions 11 and 12 is selected to be of an opposite type to the parts 10 and 20 of the active portion of the substrate 100. For example, the parts 10 and 20 have a p-type doping, which can be obtained with boron (B), and the portions 11 and 12 have an n-type doping, which may be obtained with phosphorus (P) or arsenic (As). Electrical junctions, which are labeled J1 and J2 in FIG. 3, are thus obtained at the respective contact interfaces of portions 11 and 12 with parts 10 and 20.

The realization of finFET transistors from the fins 11 and 12 (FIG. 4) may then be continued in a known manner. The mask M is removed, for example using a selective etching process on the silica. The fins 11 and 12 can then be thermally oxidized on the surface, in order to create thin gate insulation layers (not represented) on the portions. Gate portions 21 and 22, which may be of polysilicon (poly-Si), are then formed on top of each fin 11 and 12. The gate portions 21 and 22 may be in the form of bridges which respectively straddle the fins 11 and 12 while being electrically insulated from said fins. Median parts of the fins 11 and 12, which are respectively in contact with the gate portions 21 and 22 by means of their inside surfaces, constitute the channels of the corresponding finFET transistors.

Figure 4:
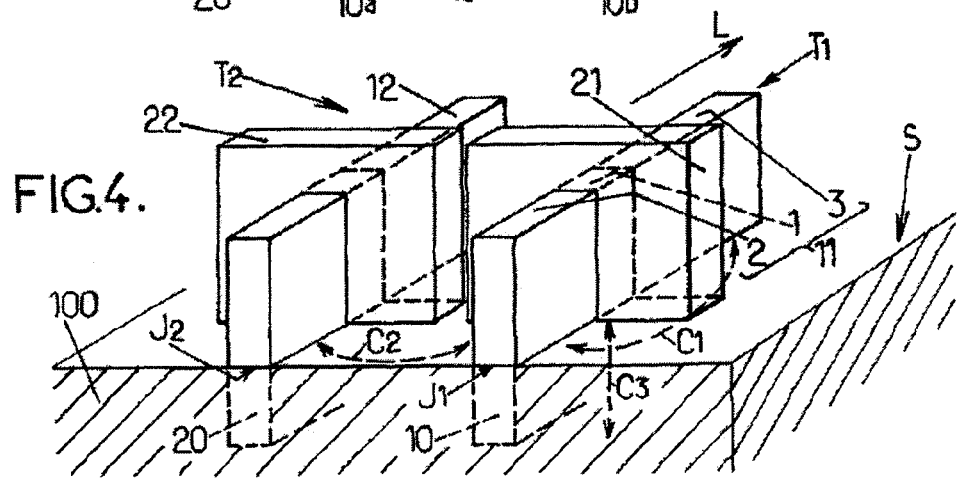

Preferably, each fin 11, 12 may have extremities which extend beyond each side of the corresponding gate portion 21, 22. In this case, each fin comprises source and drain zones of the obtained finFET transistor, in addition to comprising the channel. In FIG. 4, which is a perspective view of the circuit obtained, the fin 11 constitutes the channel 1 and the source 2 and drain 3 zones of the same transistor. The source 2 and drain 3 zones are thus situated in the continuous extension of the channel 1, on each side of it. L designates the direction of conduction of this transistor, which is parallel to the surface S. The electrical junction J1 also extends continuously under the channel 1 and under the source 2 and drain 3 zones.

The two transistors obtained are labeled T1 and T2. The fin 11 which forms the channel and the source and drain zones of the transistor T1 is isolated from the substrate 100 by the electrical junction J1, when the fin 11 is brought to an electrical potential which is greater than that of the substrate 100. Similarly, the fin 12 which forms the channel and the source and drain zones of the transistor T2 is isolated from the substrate 100 by the electrical junction J2. In this manner, the following leakage current paths are cut off by the electrical junctions J1 and J2: the path C1 which connects, for each transistor T1, T2 through the substrate 100, the source and drain zones of the same transistor, the path C2 which connects the fins 11 and 12 to each other through the substrate 100, and the path C3 which connects each fin 11, 12 to a lower part of the substrate 100. Each transistor T1, T2 is therefore electrically insulated in an effective manner, such that no leakage current via the substrate 100 interferes with its operation.

It is understood that many adaptations of the process may be introduced with respect to the implementation described above, while retaining at least some of its advantages. In particular, the cited dimensions and materials may be modified. The process can also be combined with already known methods for reducing the width w of the fins of finFET transistors.

Lastly, an alternative implementation of the process may consist of forming the material of the fin with an initial composition which already comprises its electrical doping. The insulating electrical junction of the fin is then directly obtained at the time of the epitaxial formation of said fin. In fact, processes for the epitaxial growth of doped semiconductor materials are known to a person skilled in the art, which directly result in appropriate doping levels for forming an insulating electrical junction. Once the junction is realized, the epitaxial growth process for the fin can be continued under conditions which result in a lower intrinsic doping.

Although preferred embodiments of the method and apparatus have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A process for realizing a finFET field effect transistor on a substrate of an integrated electronic circuit, comprising the following steps:
   forming a mask on a surface of the substrate, with said mask comprising an opening located above a part of an active portion of the substrate;
   realizing an implantation of doping particles through the mask opening into said exposed part of the active portion of the substrate, so as to create in said exposed part of the active portion, an electrical doping of a first type; and
   forming, by epitaxial growth from the part of the active portion which is exposed in the mask opening, a thin fin portion of crystalline semiconductor material comprising at least the channel of the transistor, the crystalline semiconductor material being doped with a second type of doping opposite the first type forming an insulating electrical junction with the first type doped part of the active portion of the substrate, the channel having an electrical direction of conduction parallel to the surface of the substrate and a height perpendicular to the surface of the substrate.

2. The process according to claim 1, wherein the thin fin portion additionally comprises source and drain zones of the transistor.

3. The process according to claim 1, wherein the thin fin portion is directly doped during the formation by epitaxial growth.

4. The process according to claim 1, wherein the thin fin portion is doped subsequent to completion of the formation by epitaxial growth.

5. A method, comprising:
   forming a mask on a surface of a substrate, said mask including an elongated opening exposing an active portion of the substrate and defining a trench;
   implanting a first type of doping particles through the elongated opening into said exposed active portion so as to create a doped region in the substrate having edges defined by the elongated opening;
   epitaxially growing a thin fin portion of crystalline semiconductor material to fill at least a portion of the trench and provide at least a channel of a transistor; and
   doping the thin fin portion of the crystalline semiconductor material with a second type of doping particles opposite the first type to form an insulating electrical junction with the first type doped part of active portion of the substrate.

6. The method of claim 5 further comprising removing the mask to leave the thin fin portion above the surface of the substrate.

7. The method of claim 5 wherein opposed side edges of the thin fin portion are aligned with opposed edges of the doped region in the substrate in a direction perpendicular to the substrate surface.

8. The method of claim 5 further comprising forming a transistor gate portion in the form of a bridge structure which straddles over the thin fin portion.

9. The method of claim 8 wherein the gate portion extends in a direction perpendicular to a longer dimension of the thin fin portion.

10. The method of claim 8 wherein the gate portion includes opposite end regions extending down to contact the surface of the substrate on either side of the doped region in the substrate and a center region above the thin fin portion.

11. The method of claim 5 wherein doping the thin fin portion is performed concurrently with epitaxially growing the thin fin portion.

12. The method of claim 5 wherein doping the thin fin portion is performed subsequent to epitaxially growing the thin fin portion.

13. A process for realizing a finFET field effect transistor on a semiconductive substrate of an integrated electronic circuit, comprising the following steps:
   forming a mask on a surface of the semiconductive substrate, with said mask comprising an opening located above a part of an active portion of the substrate;
   implanting dopant of a first type through the mask opening into said exposed part of the active portion of the semiconductive substrate; and
   epitaxially growing from the part of the active portion of the semiconductive substrate which is exposed in the mask opening, a thin fin portion of crystalline semiconductor material comprising at least the channel of the transistor, the crystalline semiconductor material being doped with a second type of dopant opposite the first type and forming an electrical junction at a contact interface between a top of the first type doped part of the active portion of the semiconductive substrate and a bottom of the channel of the second type doped epitaxially grown thin fin portion, the channel having an electrical direction of conduction parallel to the surface of the substrate and a height perpendicular to the surface of the substrate.

14. The process according to claim 13, wherein the thin fin portion additionally comprises source and drain zones of the transistor.

15. The process according to claim 13, wherein the thin fin portion is directly doped during the formation by epitaxial growth.

16. The process according to claim 13, wherein the thin fin portion is doped subsequent to completion of the formation by epitaxial growth.

17. A method, comprising:
   forming a mask on a surface of a monocrystalline substrate, said mask including an elongated opening exposing an active portion of the monocrystalline substrate and defining a trench;
   implanting a first type of doping particles through the elongated opening into said exposed active portion so as to create a doped region in the monocrystalline substrate having edges defined by the elongated opening;
   epitaxially growing a thin fin portion of crystalline semiconductor material to fill at least a portion of the trench and provide at least a channel of a transistor; and
   doping the thin fin portion of the crystalline semiconductor material with a second type of doping particles opposite the first type to form an electrical junction of opposite dopants at a contact interface between a top of the first type doped part of active portion of the monocrystalline substrate and a bottom of the channel of the thin fin portion.

18. The method of claim 17 further comprising removing the mask to leave the thin fin portion above the surface of the substrate.

19. The method of claim 17 wherein opposed side edges of the thin fin portion are aligned with opposed edges of the doped region in the substrate in a direction perpendicular to the substrate surface.

20. The method of claim 17 further comprising forming a transistor gate portion in the form of a bridge structure which straddles over the thin fin portion.

21. The method of claim 20 wherein the gate portion extends in a direction perpendicular to a longer dimension of the thin fin portion.

22. The method of claim 20 wherein the gate portion includes opposite end regions extending down to contact the surface of the substrate on either side of the doped region in the substrate and a center region above the thin fin portion.

23. The method of claim 17 wherein doping the thin fin portion is performed concurrently with epitaxially growing the thin fin portion.

24. The method of claim 17 wherein doping the thin fin portion is performed subsequent to epitaxially growing the thin fin portion.

* * * * *